United States Patent
Haruki

(10) Patent No.: US 7,242,628 B2
(45) Date of Patent: Jul. 10, 2007

(54) SEMICONDUCTOR DEVICE WITH SENSE AMPLIFIER FOR MEMORY CELLS

(75) Inventor: Tadashi Haruki, Tokyo (JP)

(73) Assignee: Elpida Memory, Inc., Chuo-ku, Tokyo (JP)

(*) Notice: Subject to any disclaimer, the term of this patent is extended or adjusted under 35 U.S.C. 154(b) by 96 days.

(21) Appl. No.: 11/076,066

(22) Filed: Mar. 10, 2005

(65) Prior Publication Data
US 2005/0201170 A1  Sep. 15, 2005

(30) Foreign Application Priority Data
Mar. 12, 2004  (JP) .............. 2004-071555

(51) Int. Cl.
*G11C 7/00* (2006.01)
(52) U.S. Cl. .................... 365/205; 365/207
(58) Field of Classification Search ........... 365/205, 365/207, 51, 63, 230.06, 214
See application file for complete search history.

(56) References Cited

U.S. PATENT DOCUMENTS 5,396,450 A * 3/1995 Takashima et al. ........... 365/51
5,590,080 A * 12/1996 Hasagawa et al. .......... 365/201
5,732,010 A * 3/1998 Takashima et al. ........... 365/63

FOREIGN PATENT DOCUMENTS

| JP | 6-12862 | 1/1994 |
|---|---|---|
| JP | 2000-276878 | 10/2000 |
| JP | 2001-102549 | 4/2001 |
| JP | 3225507 | 8/2001 |
| JP | 2001-273764 | 10/2001 |
| JP | 3302796 | 4/2002 |

* cited by examiner

*Primary Examiner*—Gene N. Auduong
(74) *Attorney, Agent, or Firm*—McGinn IP Law Group, PLLC

(57) ABSTRACT

A configuration is provided with: memory cell arrays, sense amplifiers, bit lines that connect the memory cells and sense amplifiers, and transfer gates that are inserted on the bit lines for ON/OFF control of the connections of the memory cells and the sense amplifiers; wherein the sense-amplifier-interior bit lines, which are the sense-amplifier sides of the bit lines from the transfer gates, are arranged at positions interposed between exterior bit lines, which are the memory-cell side of the bit lines from the transfer gates.

20 Claims, 6 Drawing Sheets

US 7,242,628 B2

SEMICONDUCTOR DEVICE WITH SENSE AMPLIFIER FOR MEMORY CELLS

BACKGROUND OF THE INVENTION

1. Field of Invention

The present invention relates to a semiconductor device provided with memory cells for storing data and sense amplifiers for reading data from the memory cells.

2. Description of the Related Art

With the trend toward greater capacity in semiconductor memory devices such as DRAM (Dynamic RAM) in recent years, a wide variety of designs have been proposed for the layout of memory cell arrays that are provided with a plurality of memory cells and sense amplifiers for reading data from the memory cells, one of these designs being the open bit-line system. The configuration of the open bit-line system is described in, for example, Japanese Patent Laid-Open Publication No. 2001-102549 and Japanese Patent Laid-Open Publication No. 2001-273764. As shown in FIG. 1, the open bit-line system is a configuration provided with a plurality of sense amplifier columns 110 that are composed of a plurality of sense amplifiers arranged in a column, and a plurality of memory cell arrays (cell plates) 100; sense amplifier columns 110 and memory cell arrays 100 being alternately arranged. Each sense amplifier is connected to two adjacent memory cell arrays 100 by a pair of bit lines 120, and reproduce data that are stored by complementary signals (two signals of opposite phase) that are received from the memory cells by way of bit lines 120.

The alternate arrangement of memory cell arrays 100 and sense amplifier columns 110 in the open bit-line system means that the number of memory cells that can be accessed in the memory cell arrays (reference plates) that are arranged outermost is reduced by half. In other words, the open bit-line system, due to its necessity for reference plates, entails the disadvantage of reduced chip size.

One example for circumventing this problem adopts a configuration in which sense amplifier column 110a is formed by an arrangement that concentrates a plurality of sense amplifiers between two memory cell arrays (cell plate) 100a (hereinbelow referred to as "sense amplifier concentrated arrangement") (See FIG. 2).

The sense amplifier concentrated arrangement does not require the above-described reference plate, and is advantageous from the standpoints of compact chip size and improved integration.

However, when laying out interconnections in the semiconductor device, the standard values for each interconnection width are found based on the level of integration and the necessary current-carrying capacity, and interconnection spacing is determined from these standard values. More specifically, where the standard value of the interconnection width is F, interconnections are each arranged to have an interconnection spacing having a pitch of at least 2 F, which is the minimum pitch.

Within a memory cell array, sufficient interconnect spacing must be ensured in order to avoid memory cells that are arranged in a matrix, and bit lines and word lines are arranged at a pitch of 3 F.

Within a sense amplifier in which memory cells do not exist, however, each interconnect is arranged at a pitch of 2 F in order to reduce the layout area. Interconnect spacing is therefore narrower within a sense amplifier than within a memory cell array, and there is the consequent concern for an increase in the influence of noise produced by coupling between signals.

For the purpose of achieving higher-speed data reproduction by sense amplifiers in semiconductor devices of recent years, transfer gates are inserted between bit lines and sense amplifiers, and a process is carried out to isolate the sense amplifiers from bit lines having large capacitive load by turning OFF the transfer gates when amplifying bit line voltage inside a sense amplifier.

Although high-speed operation is possible in such a configuration because the capacitive load of bit lines on the sense amplifier side from the transfer gates (hereinbelow referred to as the "sense-amplifier-interior bit lines") is reduced, noise tends to intrude from the outside, and this raises the danger that sufficient noise margin cannot be ensured in the sense amplifier.

No method has been proposed in the prior art for reducing this intrusion of noise in bit lines inside the sense amplifiers, and reducing noise has therefore been problematic.

SUMMARY OF THE INVENTION

It is an object of the present invention to provide a semiconductor device that is provided with an interconnect layout that can reduce noise that intrudes into sense-amplifier-interior bit lines.

To achieve the above-described object, the present invention is a configuration that is provided with: a memory cell array; sense amplifiers; bit lines for connecting the memory cells and sense amplifiers; and transfer gates that are inserted in the bit lines for turning on/off the connections between the memory cells and the sense amplifiers; wherein the sense-amplifier-interior bit lines, which are the bit lines that are on the side of the sense amplifiers from the transfer gates, are arranged at positions interposed between exterior bit lines, which are the bit lines that are on the side of the memory cells from the transfer gates.

In such a configuration, sense-amplifier-interior bit lines, which have a small capacitive load and are therefore prone to the intrusion of noise, are shielded by exterior bit lines, which have a large capacitive load and are therefore relatively unaffected by sources of noise. The intrusion of noise into sense-amplifier-interior bit lines can thus be limited.

The above and other objects, features, and advantages of the present invention will become apparent from the following description with reference to the accompanying drawings, which illustrate examples of the present invention.

DETAILED DESCRIPTION OF THE PREFERRED EMBODIMENT

Explanation first regards a sense amplifier belonging to a semiconductor device of the present invention with reference to the accompanying drawings.

Figure 3:
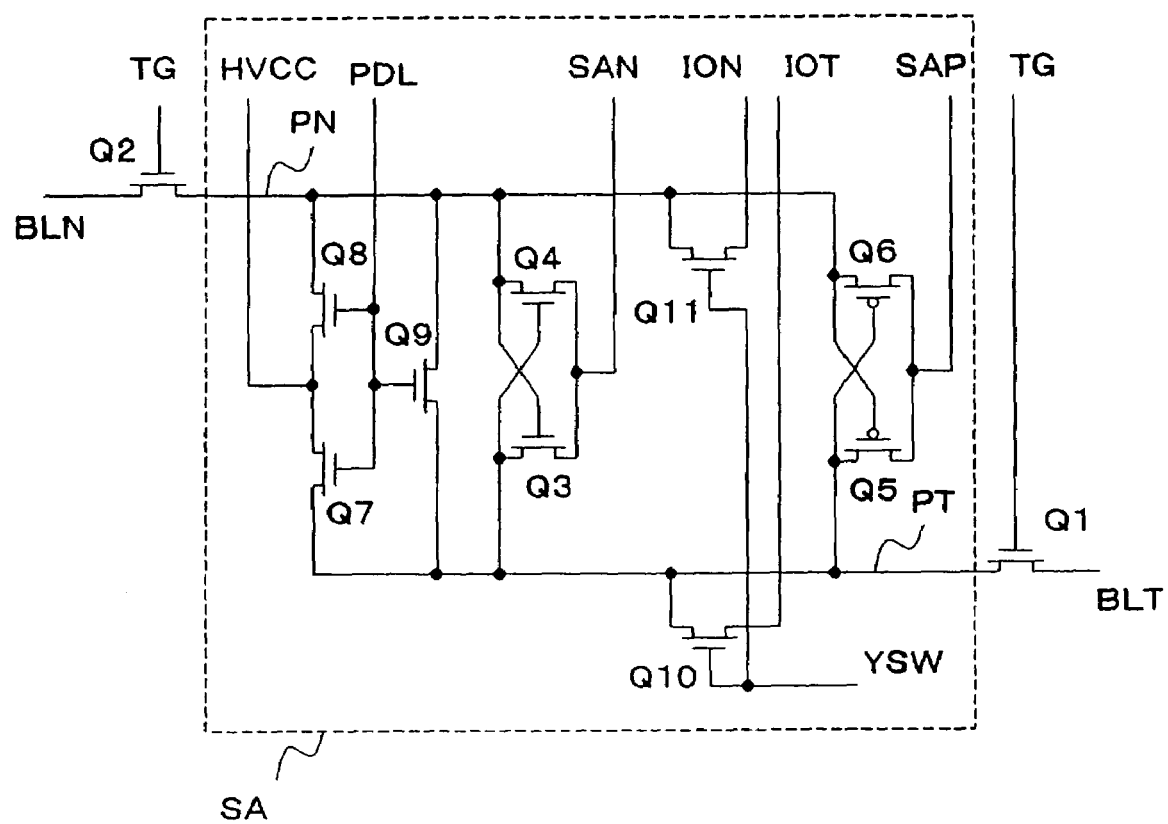
FIG. 3 is a circuit diagram showing an example of the configuration of a sense amplifier belonging to a semiconductor device of the present invention.

FIG. 3 is a circuit diagram showing an example of the configuration of a sense amplifier belonging to the semiconductor device of the present invention. In the following description, components referred to as "transistors" indicate field-effect transistors (FETs).

As shown in FIG. 3, sense amplifier SA is connected to bit lines (hereinbelow referred to as "exterior bit lines") BLT and BLN that are in turn connected to a memory cell array by way of n-channel transistors Q1 and Q2, which are transfer gates. ON/OFF control signals TG from a control circuit (not shown) are supplied to the gates of n-channel transistors Q1 and Q2.

Sense amplifier SA is a configuration having: n-channel transistors Q7–Q9 for pre-charging sense-amplifier-interior bit lines PT and PN; n-channel transistors Q3 and Q4 and p-channel transistors Q5 and Q6 for amplifying the signal voltage that is read from memory cells by way of exterior bit lines BLT and BLN; and n-channel transistors Q10 and Q11 for supplying to the outside the voltages of sense-amplifier-interior bit lines PT and PN that have been amplified by n-channel transistors Q3 and Q4 and p-channel transistors Q5 and Q6.

Control signal PDL for controlling the pre-charge operation are supplied from a control circuit (not shown) to the gates of n-channel transistors Q7–Q9, and a prescribed pre-charge voltage HVCC that is generated outside is supplied to the sources of n-channel transistors Q7 and Q8. A voltage of, for example, one-half of power-supply voltage VCC is supplied as pre-charge voltage HVCC.

The above-described pre-charge voltage HVCC is supplied via signal line SAN to the sources of n-channel transistors Q3 and Q4 during the pre-charge operation, and the ground voltage is supplied to the sources of n-channel transistors Q4 and Q5 during the sense operation (when amplifying the above-described signal voltage). The above-described pre-charge voltage HVCC is supplied via signal lines SAP to the sources of p-channel transistors Q5 and Q6 during the pre-charge operation, and the power supply voltage VCC is supplied to the sources of p-channel transistors Q5 and Q6 during the sense operation (when amplifying the above-described signal voltage).

N-channel transistors Q3 and Q4 and p-channel transistors Q5 and Q6 amplify the difference in initial voltage (difference in signal voltages) between sense-amplifier-interior bit lines PT and PN, and set sense-amplifier-interior bit lines PT and PN to the power-supply voltage VCC or the ground voltage.

Switch signal YSW for selecting sense amplifiers SA is supplied from a control circuit (not shown) to the gates of n-channel transistors Q10 and Q11; and the voltages of each of sense-amplifier-interior bit lines PT and PN that have been amplified by n-channel transistors Q3 and Q4 and p-channel transistors Q5 and Q6 are supplied as complementary data IOT and ION from the drains of n-channel transistors Q10 and Q11, respectively.

During the pre-charge operation of sense amplifier SA in this type of configuration, "High" is supplied as control signal PDL from a control circuit to the gates of n-channel transistors Q7, Q8, and Q9, whereby n-channel transistors Q7, Q8, and Q9 are each turned ON. At this time, sense-amplifier-interior bit lines PT and PN are each supplied with pre-charge voltage HVCC.

Next, upon the start of the sense operation of data that have been read from memory cells by sense amplifier SA, pre-charge voltage PDL switches to "Low," and transistors Q7, Q8, and Q9 each turn OFF. In addition, ON/OFF control signal TG switches to "High," n-channel transistors Q1 and Q2 each turn ON, and the signal voltages that have been read from memory cells are each supplied to sense-amplifier-interior bit lines PT and PN, respectively, by way of exterior bit lines BLT and BLN.

When the signal voltages have been read from memory cells to sense-amplifier-interior bit lines PT and PN, control signal TG switches to "Low," and n-channel transistors Q1 and Q2, which are transfer gates, each turn OFF. At this time, due to the isolation from exterior bit lines BLT and BLN to which a multiplicity of memory cells are connected, the capacitive load of sense-amplifier-interior bit lines PT and PN decreases. As a result, the sense operation (amplification of signal voltages) can be realized at high speed.

N-channel transistors Q3 and Q4 and p-channel transistors Q5 and Q6 amplify the initial voltage differences of sense-amplifier-interior bit lines PT and PN, respectively, and set sense-amplifier-interior bit lines PT and PN to the power supply voltage VCC or the ground voltage.

Here, the voltage of signal lines SAN and SAP is at the level of the pre-charge voltage HVCC during the pre-charge operation as described hereinabove and is set to the power supply voltage VCC or the ground voltage during the sense operation. The change in voltage level of signal lines SAN and SAP is therefore great, and these lines are therefore noise sources that apply noise to other signal lines.

N-channel transistors Q10 and Q11 supply the voltages of sense-amplifier-interior bit lines PT and PN that have been amplified by sense amplifier SA to the outside as complementary data IOT and ION.

When implementing the layout of sense amplifier SA that is shown in FIG. 3, exterior bit lines BLT and BLN and sense-amplifier-interior bit lines PT and PN are arranged using the same interconnect layer and substantially parallel to the direction of orientation (hereinbelow referred to as horizontal direction) of the two memory cell arrays. In addition, signal line SAN and signal line SAP are also arranged parallel to the direction of orientation of the two memory cell arrays, and are arranged using another interconnect layer at prescribed positions and in a direction orthogonal to sense-amplifier-interior bit lines PT and PN (hereinbelow referred to as the vertical direction).

The other signal lines are principally arranged using other interconnect layers in a vertical direction that is perpendicular to sense-amplifier-interior bit lines PT and PN. However, signal lines for the pre-charge voltage HVCC and complementary data IOT and ION are sometimes arranged in a horizontal direction locally. Thus, signal line SAN and signal line SAP are the signal lines that, among signal lines that are arranged parallel to sense-amplifier-interior bit lines PT and PN, are the signal lines that run parallel to sense-amplifier-interior bit lines PT and PN over the greatest distance and thus are the principal source of noise to sense-amplifier-interior bit lines PT and PN. However, when driver circuits are inserted in signal line SAN and signal line SAP, the wiring that is used in these circuits may also serve as a noise source.

Explanation next regards the specific method of laying out sense-amplifier-interior bit lines PT and PN shown in FIG. 3 with reference to the accompanying drawings.

Figure 1:
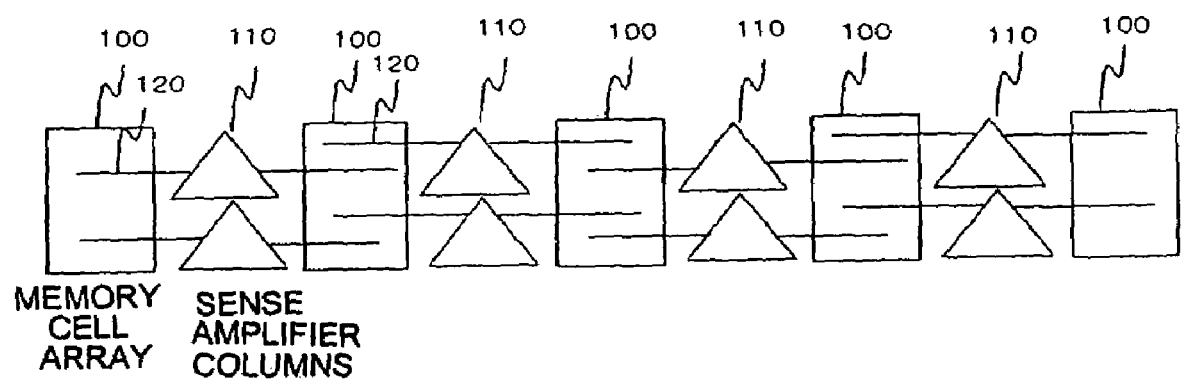
FIG. 1 is a schematic view showing the configuration of an open bit-line system.
Figure 2:
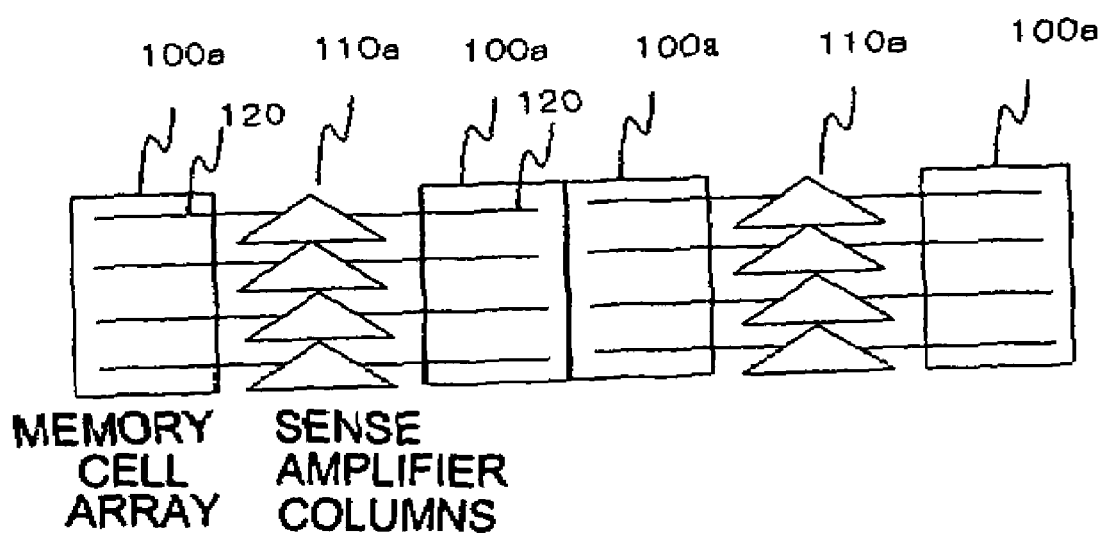
FIG. 2 is a schematic view showing a sense amplifier concentrated arrangement system.

The following description takes as an example a semiconductor device of the sense amplifier concentrated arrangement type that is shown in FIG. 2 in which a plurality of sense amplifiers are arranged in concentration between two memory cell arrays.

FIRST WORKING EXAMPLE

Figure 4:
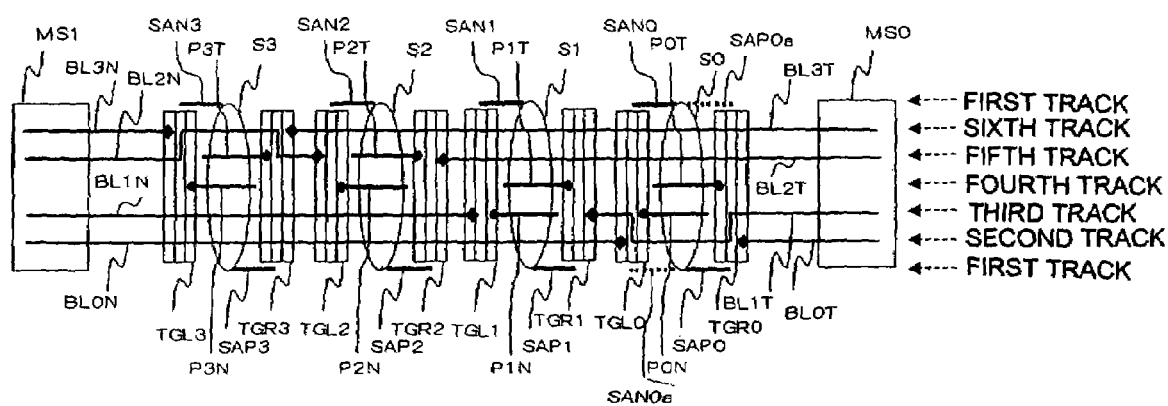
FIG. 4 is a layout diagram showing the configuration of the first working example of the semiconductor device of the present invention.

FIG. 4 is a layout diagram showing the configuration of the first working example of the semiconductor device of the present invention.

As shown in FIG. 4, the semiconductor device of the first working example is a configuration in which four sense amplifiers S0–S3 are arranged in a series between two memory cell arrays, memory cell array MS0 and memory cell array MS1.

Transfer gates TGR0 and TGL0 are arranged on both sides of sense amplifier S0, transfer gates TGR1 and TGL1 are arranged on both sides of sense amplifier S1, transfer gates TGR2 and TGL2 are arranged on both sides of sense amplifier S2, and transfer gates TGR3 and TGL3 are arranged on both sides of sense amplifier S3.

Between memory cell arrays MS0–MS1 and sense amplifiers S0–S3, the interconnect spacing is set to six wiring tracks (first track to sixth track) of a pitch of 2 F (the minimum pitch); and exterior bit lines BLT and BLN, sense-amplifier-interior bit lines PT and PN, or signal lines SAN and SAP are each arranged on these interconnect tracks. Although FIG. 4 shows only two memory cell arrays MS0 and MS1 and four sense amplifiers S0–S3, an actual semiconductor device may be a configuration that is provided with a plurality of the configurations shown in FIG. 4 in the vertical direction of the figure. Thus, the first track (the first track that is adjacent to the sixth track) in the upper portion of the figure is the wiring track provided for wiring between memory cell arrays MS0 and MS1 (not shown in the figure) and sense amplifiers S0–S3, which are adjacent.

The first track is used for arranging each of signal lines SAN0, SAN1, SAN2, and SAN3 that correspond to signal line SAN or signal lines SAP0, SAP1, SAP2, and SAP3 that correspond to signal line SAP of each sense amplifiers S0–S3 that are shown in FIG. 3.

In FIG. 4, an example is shown in which signal lines SAN0, SAN1, SAN2, and SAN3 are arranged in the first track that is at the upper part of the figure, and signal lines SAP0, SAP1, SAP2, and SAP3 are arranged in the first track that is in the lower part of the figure, but the present invention is not limited to this configuration. For example, signal line SAN0a and signal line SAP0 for sense amplifier S0 may each be arranged using the first track at the lower part of the figure. In such a case, the first track in the upper portion of the figure is used for the wiring of signal line SAN0 and signal line SAP0a for a sense amplifier (not shown) that is arranged adjacent to the upper portion of the figure.

Alternatively, signal line SAN0 and signal line SAP0a for sense amplifier S0 may each be arranged using the first track that is in the upper portion of the figure. In this case, the first track that is in the lower portion of the figure is used for the arrangement of signal line SAN0a and signal line SAP0 for the sense amplifier (not shown) that is arranged adjacent to the lower portion of the figure.

Further, the first track that is in the upper portion of the figure may be shared by the sense amplifier (not shown) that is arranged adjacent to the upper portion of the figure, or the first track in the lower portion of the figure may be shared with the sense amplifier (not shown) that is arranged adjacent to the lower portion of the figure.

Although not shown in the figures because the figures would become too complex, sense amplifiers S1, S2, and S3 are each wired for signal lines SAN and signal lines SAP similarly to sense amplifier S0. Although not shown in the other working examples described hereinbelow, this configuration is also assumed to apply similarly.

As shown in FIG. 4, in the semiconductor device of the first working example, exterior bit lines BL0T–BL3T are each connected to memory cell array MS0 via the second, third, fifth, sixth tracks. In addition, exterior bit lines BL0N–BL3N are connected to memory cell array MS1 via the second, third, fifth and sixth tracks.

Exterior bit line BL0T terminates at one end of transfer gate TGR0. The other end of transfer gate TGR0 is connected via the fourth track to sense amplifier S0 by sense-amplifier-interior bit line P0T.

Exterior bit line BL1T moves from the third track to the second track on transfer gate TGR0 (the transfer gate and exterior bit line are in different interconnect layers); moves from the second track to the third track on transfer gate TGL0; and terminates at the end of transfer gate TGR1. The other end of transfer gate TGR1 is connected via the fourth track to sense amplifier S1 by way of sense-amplifier-interior bit line P1T.

Exterior bit line BL2T terminates at the end of transfer gate TGR2. The other end of transfer gate TGR2 is connected via the fifth track to sense amplifier S2 by way of sense-amplifier-interior bit line P2T.

In addition, exterior bit line BL3T terminates at one end of transfer gate TGR3. The other end of transfer gate TGR3 is connected via the fifth track to sense amplifier S3 by way of sense-amplifier-interior bit line P3T.

On the other hand, exterior bit line BL0N terminates at one end of transfer gate TGL0. The other end of transfer gate TGL0 is connected via the third track to sense amplifier S0 by way of sense-amplifier-interior bit line P0N.

In addition, exterior bit line BL1N terminates at one end of transfer gate TGL1. The other end of transfer gate TGL1 is connected via the third track to sense amplifier S1 by way of sense-amplifier-interior bit line P1N.

Exterior bit line BL2N moves from the fifth track to the sixth track on transfer gate TGL3; moves from the sixth track to the fifth track on transfer gate TGR3; and terminates at the end of transfer gate TGL2. The other end of transfer gate TGL2 is connected via the fourth track to sense amplifier S2 by way of sense-amplifier-interior bit line P2N.

Exterior bit line BL3N terminates at the end of transfer gate TGL3. The other end of transfer gate TGL3 is connected via the fourth track to sense amplifier S3 by way of sense-amplifier-interior bit line P3N.

By means of the above-described layout, sense-amplifier-interior bit lines P(0–3)T and P(0–3)N are arranged in the third, fourth, and fifth tracks, and, relative to signal lines SAN0–3 and SAP0–3 that are arranged on the first track, exterior bit lines BL0T, BL0N, and BL1T that are arranged on the second track are interposed, and exterior bit lines BL3T, BL3N, and BL2N that are arranged on the sixth track are also interposed.

Although exterior bit lines BLT and BLN are adjacent to the wiring of signal lines SAN0–3 and SAP0–3, since the capacitive load of exterior bit line BLT and BLN is on the order of 100 fF and this load is greater than the capacitive load of sense-amplifier-interior bit lines PT and PN (the tens fF), the influence of noise from signal lines SAN0–3 and SAP0–3 is relatively light.

Accordingly, by arranging exterior bit lines BLT and BLN between signal lines SAN0–3, SAP0–3 and sense-amplifier-interior bit lines P(0–3)T, P(0–3)N, sense-amplifier-interior bit lines P(0–3)T and P(0–3)N are shielded by exterior bit line BLT and BLN and the influence of noise from signal lines SAN0–3 and SAP0–3 can be reduced.

SECOND WORKING EXAMPLE

Figure 5:
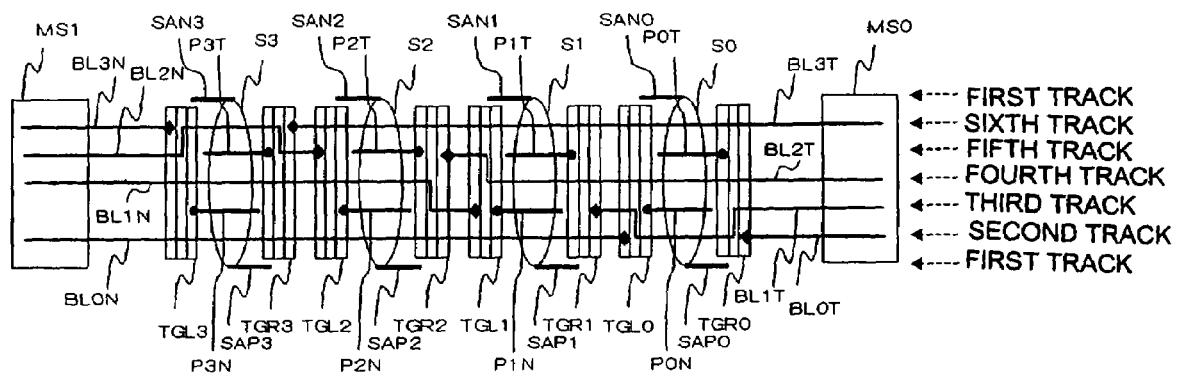
FIG. 5 is a layout diagram showing the configuration of the second working example of the semiconductor device of the present invention.

FIG. 5 is a layout diagram showing the configuration of the second working example of the semiconductor device of the present invention. As shown in FIG. 5, the semiconductor device of the second working example is a configuration in which, as in the first working example, four sense amplifiers S0–S3 are arranged in a series between two memory cell arrays, memory cell array MS0 and memory cell array MS1.

Transfer gates TGR0 and TGL0 are arranged at both sides of sense amplifier S0, transfer gates TGR1 and TGL1 are arranged at both sides of sense amplifier S1, transfer gates TGR2 and TGL2 are arranged at both sides of sense amplifier S2, and transfer gates TGR3 and TGL3 are arranged at both sides of sense amplifier S3.

In addition, six interconnect tracks (first track-sixth track) with interconnect spacing having a pitch of 2 F are set between memory cell arrays MS0 and MS1 and sense amplifiers S0–S3, and exterior bit lines BLT and BLN, sense-amplifier-interior bit lines PT and PN, and signal lines SAN and SAP are arranged on these interconnect tracks.

As in the first embodiment, the first track is used for arranging signal lines SAN0, SAN1, SAN2, and SAN3 of each of sense amplifiers S0–S3 that correspond to signal line SAN shown in FIG. 3 and for signal lines SAP0, SAP1, SAP2, and SAP3 that correspond to signal line SAP.

As shown in FIG. 5, in the semiconductor device of the second working example, exterior bit lines BL0T–BL3T are wired to memory cell array MS0 via the second, third, and sixth tracks. In addition, exterior bit lines BL0N–BL3N are wired to memory cell array MS1 via the second, fourth, fifth and sixth tracks.

Exterior bit line BL0T terminates at one end of transfer gate TGR0. The other end of transfer gate TGR0 is connected via the fifth track to sense amplifier S0 by way of sense-amplifier-interior bit line P0T.

Exterior bit line BL1T moves from the third track to the second track on transfer gate TGR0, moves from the second track to the third track on transfer gate TGL0, and terminates at one end of transfer gate TGR1. The other end of transfer gate TGR1 is connected via the fifth track to sense amplifier S1 by way of sense-amplifier-interior bit line P1T.

Exterior bit line BL2T moves from the fourth track to the fifth track on transfer gate TGL1 and terminates at one end of transfer gate TGR2. The other end of transfer gate TGR2 is connected via the fifth track to sense amplifier S2 by way of sense-amplifier-interior bit line P2T.

Exterior bit line BL3T terminates at one end of transfer gate TGR3. The other end of transfer gate TGR3 is connected via the fifth track to sense amplifier S3 by way of sense-amplifier-interior bit line P3T.

Exterior bit line BL0N terminates at one end of transfer gate TGL0. The other end of transfer gate TGL0 is connected via the third track to sense amplifier S0 by way of sense-amplifier-interior bit line P0N.

Exterior bit line BL1N moves from the fourth track to the third track on transfer gate TGR2, and terminates at one end of transfer gate TGL1. The other end of transfer gate TGL1 is connected via the third track to sense amplifier S1 by way of sense-amplifier-interior bit line P1N.

Exterior bit line BL2N moves from the fifth track to the sixth track on transfer gate TGL3, moves from the sixth track to the fifth track on transfer gate TGR3, and terminates at one end of transfer gate TGL2. The other end of transfer gate TGL2 is connected via the third track to sense amplifier S2 by way of sense-amplifier-interior bit line P2N.

Exterior bit line BL3N terminates at one end of transfer gate TGL3. The other end of transfer gate TGL3 is connected via the third track to sense amplifier S3 by way of sense-amplifier-interior bit line P3N.

The above-described layout realizes a configuration in which sense-amplifier-interior bit lines P(0–3)T are arranged at the fifth track, and sense-amplifier-interior bit lines P(0–3)N are arranged at the third track, whereby each of sense-amplifier-interior bit lines P(0–3)T and P(0–3)N are interposed between exterior bit lines.

Thus, as in the first working example, the arrangement of exterior bit lines BLT and BLN between signal lines SAN0–3, SAP0–3 and sense-amplifier-interior bit lines P(0–3)T and P(0–3)N allows sense-amplifier-interior bit lines P(0–3)T and P(0–3)N to be shielded by exterior bit lines BLT and BLN, and the influence of noise from signal lines SAN0–3 and SAP0–3, which are a source of noise, can therefore be reduced.

Still further, in the present working example, the sense-amplifier-interior bit lines (P0T and P0N, P1T and P1N, P2T and P2N, P3T and P3N) are separated from each other by exterior bit lines BL2T and BL1N that are arranged in the fourth track, and as a result, exterior bit lines BL2T and BL1N serve the role of shields and the effect of coupling between the sense-amplifier-interior bit lines can therefore be eliminated.

THIRD WORKING EXAMPLE

Figure 6:
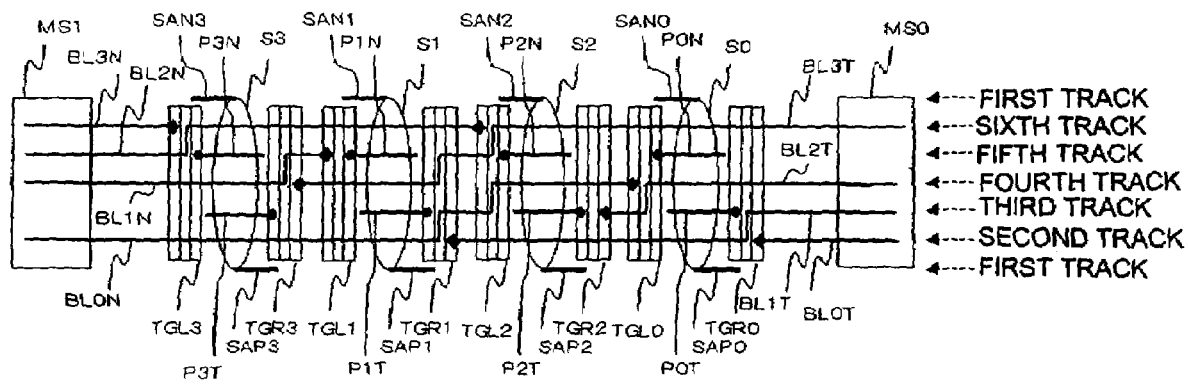
FIG. 6 is a layout diagram showing the configuration of the third working example of the semiconductor device of the present invention.

FIG. 6 is a layout diagram showing the configuration of the third working example of the semiconductor device of the present invention.

As shown in FIG. 6, the semiconductor device of the third working example differs from the first and second working examples in that the position of arrangement of sense amplifiers S1 and S2 between two memory cell arrays, memory cell array MS0 and memory cell array MS1, is switched.

Accompanying this switch, the positions of transfer gate TGR1 and transfer gate TGR2 are switched, and the positions of transfer gate TGL1 and transfer gate TGL2 are switched. The positions of the remaining sense amplifiers S0 and S3 and the positions of the remaining transfer gates TGR0, TGL0, TGR3, and TGL3 are as in the first and second working examples.

As with the first and second working examples, the first track is used for the wiring of signal lines SAN0, SAN1, SAN2, and SAN3 of each of the sense amplifiers S0–S3 that correspond to signal line SAN shown in FIG. 3, or of signal lines SAP0, SAP1, SAP2, and SAP3 that correspond to signal line SAP.

As shown in FIG. 6, in the semiconductor device of the third working example, exterior bit lines BL0T–BL3T are each wired to memory cell array MS0 via the second, the fourth, the fifth, and the sixth tracks. In addition, exterior bit lines BL0N–BL3N are wired to memory cell array MS1 via the second, fourth, fifth, and sixth tracks.

Exterior bit line BL0T terminates at one end of transfer gate TGR0. The other end of transfer gate TGR0 is connected via the third track to sense amplifier S0 by way of sense-amplifier-interior bit line P0T.

Exterior bit line BL1T moves from the third track to the second track on transfer gate TGR0, and terminates at one end of transfer gate TGR1. The other end of transfer gate TGR1 is connected via the third track to sense amplifier S1 by way of sense-amplifier-interior bit line P1T.

Exterior bit line BL2T moves from the fourth track to the third track on transfer gate TGL0, and terminates at one end of transfer gate TGR2. The other end of transfer gate TGR2 is connected via the third track to sense amplifier S2 by way of sense-amplifier-interior bit line P2T.

Exterior bit line BL3T moves from the sixth track to the fifth track on transfer gate TGL2, moves from the fifth track to the fourth track on transfer gate TGR1, and terminates at one end of transfer gate TGR3. The other end of transfer gate TGR3 is connected via the third track to sense amplifier S3 by way of sense-amplifier-interior bit line P3T.

Exterior bit line BL0N moves from the second track to the third track on transfer gate TGR1, moves from the third track to the fourth track on transfer gate TGL2, and terminates at one end of transfer gate TGL0. The other end of transfer gate TGL0 is connected via the fifth track to sense amplifier S0 by way of sense-amplifier-interior bit line P0N.

Exterior bit line BL1N moves from the fourth track to the fifth track on transfer gate TGR3, and terminates at one end of transfer gate TGL1. The other end of transfer gate TGL1 is connected via the firth track to sense amplifier S1 by way of sense-amplifier-interior bit line P1N.

Exterior bit line BL2N moves from the fifth track to the sixth track on transfer gate TGL3, and terminates at one end of transfer gate TGL2. The other end of transfer gate TGL2 is connected via the fifth track to sense amplifier S2 by way of sense-amplifier-interior bit line P2N.

Exterior bit line BL3N terminates at one end of transfer gate TGL3. The other end of transfer gate TGL3 is connected via the fifth track to sense amplifier S3 by way of sense-amplifier-interior bit line P3N.

By implementing the above-described layout, a configuration is realized in which sense-amplifier-interior bit lines P(0–3)T are arranged in the third track, sense-amplifier-interior bit lines P(0–3)N are arranged in the fifth track, whereby each of sense-amplifier-interior bit lines P(0–3)T and P(0–3)N are interposed between exterior bit lines.

Accordingly, as in the first and second working examples, the arrangement of exterior bit lines BLT and BLN between signal lines SAN0–3, SAP0–3 and sense-amplifier-interior bit lines P(0–3)T, P(0–3)N enables a reduction of the influence of noise from signal lines SAN0–3 and SAP0–3 upon sense-amplifier-interior bit lines P(0–3)T and P(0–3)N.

Further, as in the second working example, sense-amplifier-interior bit lines (P0T and P0N, P1T and P1N, P2T and P2N, and P3T and P3N) are separated by exterior bit lines BL2T, BL0N, BL3T and BL1N that are arranged in the fourth track, and the influence of coupling between sense-amplifier-interior bit lines can therefore be eliminated.

While a preferred embodiment of the present invention has been described using specific terms, such description is for illustrative purposes only, and it is to be understood that changes and variations may be made without departing from the spirit or scope of the following claims.

What is claimed is:

1. A semiconductor device, comprising:
 a memory cell array that is provided with a plurality of memory cells;
 sense amplifiers for reading data that have been stored in said memory cells;
 bit lines for connecting said memory cells and said sense amplifiers; and
 transfer gates that are inserted on said bit lines for turning on/off connections between said memory cells and said sense amplifiers;
 wherein sense-amplifier-interior bit lines, which comprise the bit lines that are on the side of said sense amplifiers from said transfer gates, are arranged at positions interposed between exterior bit lines, which are the bit lines that comprise on the side of said memory cells from said transfer gates, and
 wherein a sense-amplifier-interior bit line connected to one sense amplifier is arranged at a position interposed between said exterior bit lines each connected to a different sense amplifier.

2. The semiconductor device according to claim 1, wherein:
 a plurality of said sense amplifiers is arranged in a series between two said memory cell arrays;
 said memory cell arrays and said sense amplifiers are each connected by a pair of bit lines in which mutually complementary signals flow; and
 a first sense-amplifier-interior bit line, which comprises the sense-amplifier side of a bit line from a transfer gate that is inserted in one bit line that is connected to any sense amplifier, and a second sense-amplifier-interior bit line, which comprises the sense-amplifier side of a bit line from a transfer gate that is inserted on the other bit line that is connected to the sense amplifier, are arranged at positions interposed between a first exterior bit line, which comprises said memory-cell side of a bit line from a transfer gate that is inserted in one bit line that is connected to another sense amplifier, and a second exterior bit line, which comprises the memory-cell side of a bit line from a transfer gate that is inserted in another bit line that is connected to another sense amplifier.

3. The semiconductor device according to claim 2, wherein:
 either one of said first exterior bit line and said second exterior bit line is arranged between said first sense-amplifier-interior bit line and said second sense-amplifier-interior bit line.

4. The semiconductor device according to claim 2, wherein: said first sense-amplifier-interior bit line, said second sense-amplifier-interior bit line, said first exterior bit line and said second exterior bit line are each arranged parallel to each other.

5. The semiconductor device according to claim 2, wherein said first sense-amplifier-interior bit line, said second sense-amplifier-interior bit line, said first exterior bit line and said second exterior bit line are each arranged at a minimum pitch spacing.

6. The semiconductor device according to claim 2, wherein said first sense-amplifier-interior bit line, said second sense-amplifier-interior bit line, said first exterior bit line, and said second exterior bit line are each arranged on the same wiring layer.

7. The semiconductor device of claim 1, wherein said sense-amplifier signal lines supply a pre-charge voltage to said sense amplifiers.

8. The semiconductor device of claim 1, wherein said sense-amplifier signal lines are set to a ground voltage during a sense operation by said sense amplifiers.

9. The semiconductor device of claim 1, wherein said exterior bit lines shield said sense-amplifier-interior bit lines from noise generated by said sense-amplifier signal lines.

10. The semiconductor device of claim 1, wherein said sense-amplifier signal lines are arranged parallel to a direction of orientation of said plurality of memory cells.

11. The semiconductor device of claim 1, wherein said sense-amplifier signal lines are arranged parallel to said sense-amplifier-interior bit lines.

12. A semiconductor device, comprising:
a plurality of memory cells;
transfer gates connected to said plurality of memory cells by exterior bit lines; and
sense amplifiers connected to said transfer gates by interior bit lines and having signal lines providing a sensed signal,
wherein said exterior bit lines are interposed between said interior bit lines and said signal lines.

13. The semiconductor device of claim 12, wherein:
a plurality of said sense amplifiers is arranged in a series between two of said plurality of memory cells;
said memory cells and said sense amplifiers are each connected by a pair of said bit lines in which mutually complementary signals flow; and
a first sense-amplifier-interior bit line, which is on the sense-amplifier side of a bit line from a transfer gate that is inserted in one bit line that is connected to any sense amplifier, and a second sense-amplifier-interior bit line, which comprises the sense-amplifier side of a bit line from a transfer gate that is inserted on the other bit line that is connected to the sense amplifier, are interposed between a first exterior bit line, which comprises a memory-cell side of a bit line from a transfer gate that is inserted in one bit line that is connected to another sense amplifier, and a second exterior bit line, which comprises the memory-cell side of a bit line from a transfer gate that is inserted in another bit line that is connected to another sense amplifier.

14. The semiconductor device of claim 13, wherein one of said first exterior bit line and said second exterior bit line is arranged between said first sense-amplifier-interior bit line and said second sense-amplifier-interior bit line.

15. The semiconductor device of claim 13, wherein said first sense-amplifier-interior bit line, said second sense-amplifier-interior bit line, said first exterior bit line and said second exterior bit line are each arranged parallel to each other.

16. The semiconductor device of claim 13, wherein said first sense-amplifier-interior bit line, said second sense-amplifier-interior bit line, said first exterior bit line and said second exterior bit line are each arranged at a minimum pitch spacing.

17. The semiconductor device of claim 13, wherein said first sense-amplifier-interior bit line, said second sense-amplifier-interior bit line, said first exterior bit line, and said second exterior bit line are each arranged on the same wiring layer.

18. The semiconductor device of claim 12, wherein said sense-amplifier signal lines supply a pre-charge voltage to said sense amplifiers.

19. The semiconductor device of claim 12, wherein said sense-amplifier signal lines are arranged parallel to a direction of orientation of said plurality of memory cells.

20. The semiconductor device of claim 12, wherein said sense-amplifier signal lines are arranged parallel to said sense-amplifier-interior bit lines.

* * * * *